(12) United States Patent
Takemura et al.

(10) Patent No.: US 6,417,057 B1
(45) Date of Patent: Jul. 9, 2002

(54) METHOD OF FORMING A SEMICONDUCTOR DEVICE HAVING A TFT UTILIZING OPTICAL ANNEALING BEFORE A GATE ELECTRODE IS FORMED

(75) Inventors: Yasuhiko Takemura, Shiga; Toshimitsu Konuma, Kanagawa, both of (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/631,826

(22) Filed: Aug. 3, 2000

Related U.S. Application Data

(62) Division of application No. 08/987,473, filed on Dec. 9, 1997, now Pat. No. 6,160,269, which is a division of application No. 08/751,559, filed on Nov. 18, 1996, now Pat. No. 5,739,549, which is a continuation of application No. 08/479,450, filed on Jun. 7, 1995, now abandoned.

(30) Foreign Application Priority Data

Jun. 14, 1994 (JP) .............................................. 6-156515

(51) Int. Cl.⁷ ........................ H01L 21/84; H01L 21/336
(52) U.S. Cl. ...................................... 438/308; 438/164
(58) Field of Search ................................ 438/149, 151, 438/160, 161, 164, 166, 197, 308

(56) References Cited

U.S. PATENT DOCUMENTS

| | | |
|---|---|---|
| 3,859,716 A | 1/1975 | Tihanyi |
| 4,757,026 A | 7/1988 | Woo et al. |
| 4,876,213 A | 10/1989 | Pfiester |
| 5,182,620 A | 1/1993 | Shimada et al. |
| 5,266,823 A | 11/1993 | Noji et al. |
| 5,308,998 A | 5/1994 | Yamazaki et al. |
| 5,323,042 A | 6/1994 | Matsumoto |
| 5,359,206 A | 10/1994 | Yamamoto et al. |
| 5,359,219 A | 10/1994 | Hwang |
| 5,396,084 A | 3/1995 | Matsumoto |
| 5,410,172 A | 4/1995 | Koizumi et al. |
| 5,412,240 A | 5/1995 | Inoue et al. |
| 5,412,493 A | 5/1995 | Kunii et al. |
| 5,463,483 A | 10/1995 | Yamazaki |

(List continued on next page.)

FOREIGN PATENT DOCUMENTS

| | | |
|---|---|---|
| JP | 4-011226 | 1/1992 |
| JP | 4-139882 | 5/1992 |
| JP | 4-340725 | 11/1992 |
| JP | 5-48107 | 2/1993 |
| JP | 5-082553 | 4/1993 |
| JP | 05-173179 | 7/1993 |
| JP | 5-183131 | 7/1993 |
| JP | 5-226651 | 9/1993 |
| JP | 05-232515 | 9/1993 |
| JP | 06-112490 | 4/1994 |

*Primary Examiner*—Charles Bowers
*Assistant Examiner*—Evan Pert
(74) *Attorney, Agent, or Firm*—Eric J. Robinson; Nixon Peabody LLP

(57) ABSTRACT

There is provided an aluminum gate type thin film transistor integrated circuit having a matrix region and a region in which driving circuits thereof are formed wherein impurity regions are selectively formed on a semiconductor thin film in the form of islands and a gate insulation film is formed to cover the impurity regions. Further, a thermal annealing or an optical annealing is performed on the impurity regions and regions in which channels are to be formed adjacent thereto and the gate insulation film to improve the characteristics of those regions themselves and to eliminate discontinuity at the boundaries between those regions. After the above-described steps, gate electrodes are formed. An anodic oxide is provided at least at the portion of a gate electrode provided in the matrix region where it intersects with a line in the layer above it to prevent the gate electrode from shorting with the line.

13 Claims, 5 Drawing Sheets

U.S. PATENT DOCUMENTS

| | | |
|---|---|---|
| 5,473,184 A | 12/1995 | Murai |
| 5,485,019 A | 1/1996 | Yamazaki et al. |
| 5,495,121 A | 2/1996 | Yamazaki et al. |
| 5,499,123 A | 3/1996 | Mikoshiba |
| 5,514,879 A | 5/1996 | Yamazaki |
| 5,650,636 A | 7/1997 | Takemura et al. |
| 5,712,495 A | 1/1998 | Suzawa |
| 5,739,549 A | 4/1998 | Takemura et al. |
| 5,764,321 A | 6/1998 | Koyama et al. |
| 5,856,689 A | 1/1999 | Suzawa |
| 6,004,831 A | 12/1999 | Yamazaki et al. |

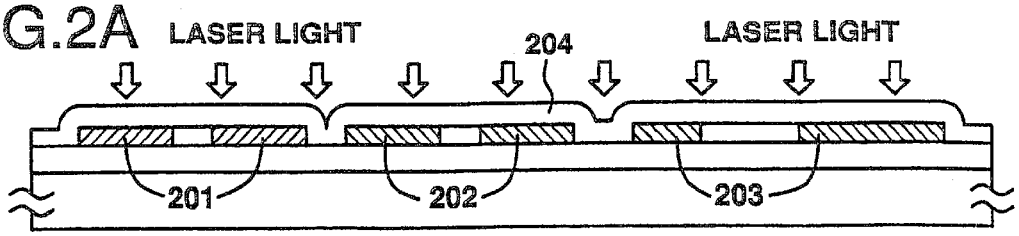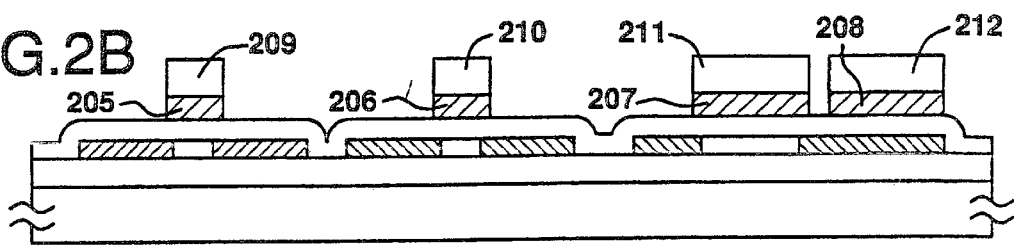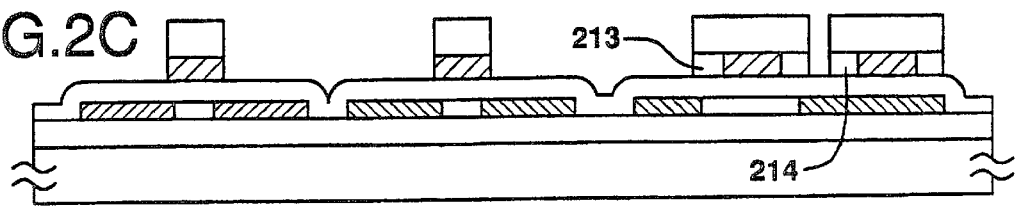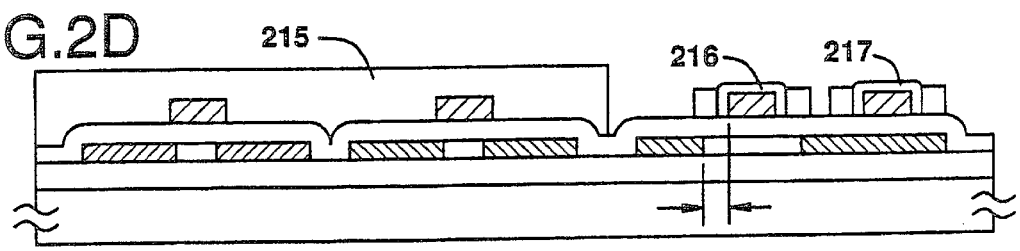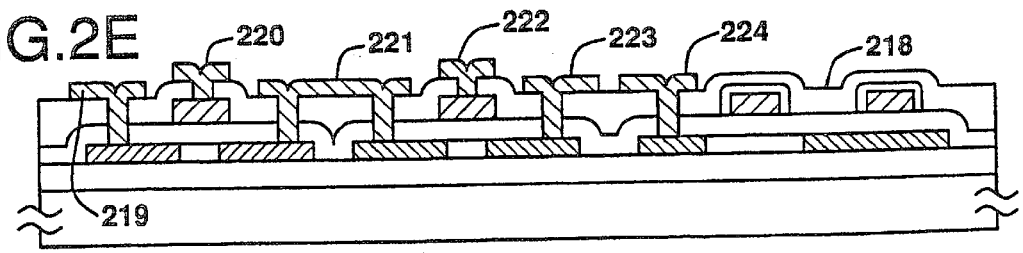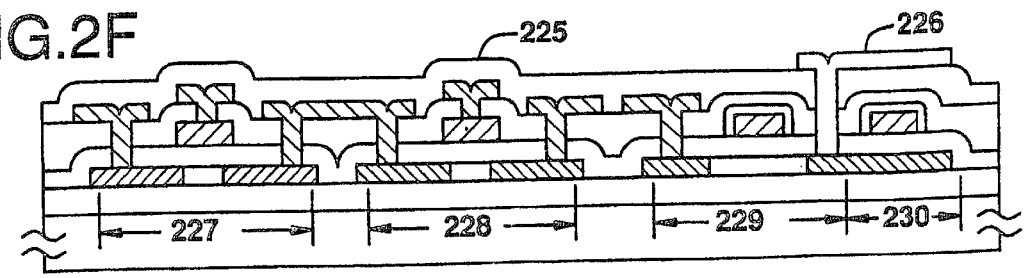

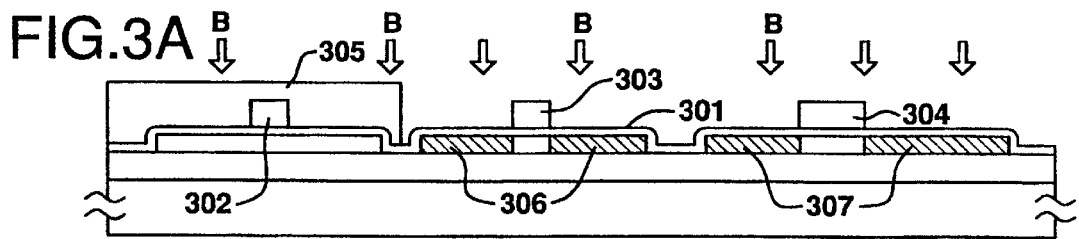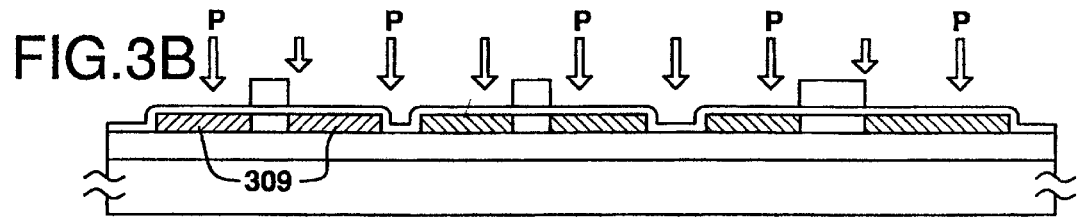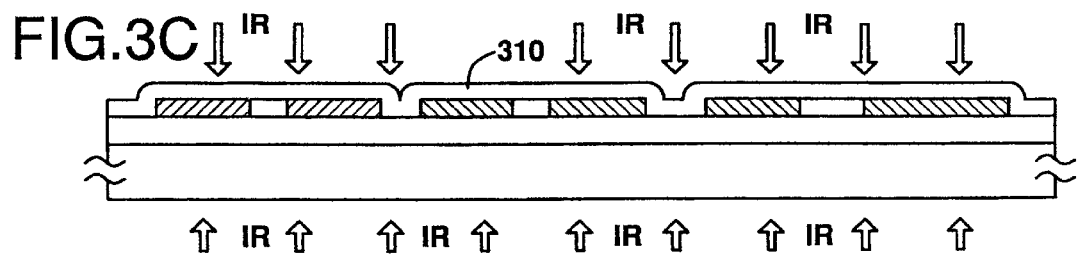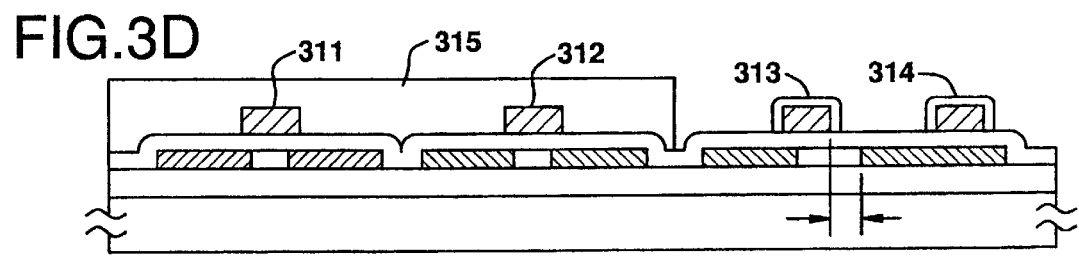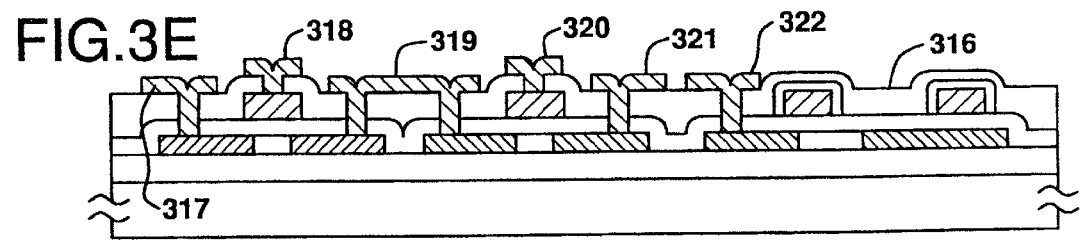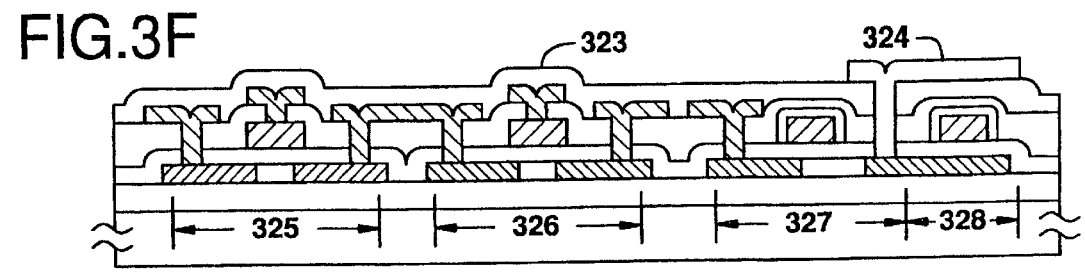

METHOD OF FORMING A SEMICONDUCTOR DEVICE HAVING A TFT UTILIZING OPTICAL ANNEALING BEFORE A GATE ELECTRODE IS FORMED

This application is a Divisional of application Ser. No. 08/987,473 filed Dec. 9, 1997 now U.S. Pat. No. 6,160,269, which is a Divisional of application Ser. No. 08/751,559 filed Nov. 18, 1996 now U.S. Pat No. 5,739,549, which is a Continuation of application Ser. No. 08/479,450 filed Jun. 7, 1995 abandoned.

BACKGROUND OF THE INVENTION

1. Field of the Invention

The present invention relates to a method of manufacturing semiconductor integrated circuits having thin film transistors formed on an insulating surface. In the context of the present invention, the term "insulating surface" means an insulating substrate, an insulating film formed thereon, or an insulating film formed on a material such as a semiconductor and metal. More particularly, the present invention relates to semiconductor integrated circuits which employ a metal material mainly composed of aluminum as the material for gate electrodes and gate lines, such as active matrix circuits used for liquid crystal displays.

2. Description of the Related Art

Thin film transistors (TFTs) have been manufactured using a self-alignment process with the aid of single crystal semiconductor integrated circuit techniques. According to this process, a gate electrode is formed on a semiconductor film with an intervening gate insulation film and impurities are introduced into the semiconductor film using the gate electrode as a mask. Impurities can be introduced using methods such as thermal diffusion, ion implantation, plasma doping, and laser doping.

Conventionally, the gate electrodes of TFTs have employed silicon having conductivity enhanced by doping with the aid of single crystal semiconductor circuit techniques. This material has high heat resistance characteristics and hence has been an idealistic material in a case wherein a high temperature process is performed. However, it has been recently found that the use of a silicon gate is not appropriate.

The first reason is that silicon has low conductivity. This problem has not been significant in devices having a relatively small surface area. However, it has become significant because the increasing size of liquid crystal displays has resulted in increases in the size of active matrix circuits and design rules (the widths of gate lines) left unchanged.

The second reason is that as the size of devices has been increased, it has become necessary to switch the material for substrates from expensive materials having high heat resistance characteristics such as quartz and silicon wafers to less expensive materials having lower heat resistance characteristics such as the glass available from Corning Corp. under product No. 7059 and the borosilicate glass available from NH Technoglass Corp. under product NA-35, NA-45 etc. Such materials have not been appropriate as materials for substrates because the formation of silicon gates involves a heating process at 650° C. or higher.

In view of such a problem, it has been necessary that the silicon gates must be replaced by aluminum gates. In this case, although pure aluminum may be used, a material such as silicon, copper and scandium (Sc) is added in a small amount because pure aluminum exhibits extremely low heat resistance characteristics. Even with such an additive, aluminum still has the problem with heat resistance characteristics. Therefore, for aluminum gates, it has not been possible to use a thermal annealing process to activate impurities after a doping process such as ion implantation utilizing accelerated ions, and optical annealing utilizing, e.g. laser irradiation has been employed for such a purpose. Even in the latter case, severe limitations have been placed on the intensity of the light to irradiate the aluminum gates in order to prevent damage to the gates by the laser irradiation.

Aluminum itself reflects light in a wide range of wavelengths including ultraviolet rays and infrared rays if it has a mirror surface. However, the use of aluminum has not been appropriate, for example, where flash-lamp annealing is employed. The reason is this process involves irradiation for a long time which results in a rise in the temperature of a silicon film caused by the light absorbed by the silicon film or the like and the temperature rise transferred to the aluminum as a result of thermal conduction causes melting and deformation of the aluminum. The same problem has been encountered in laser annealing and in a method wherein continuously oscillated laser beams are irradiated. When an extremely short oscillation pulse laser is irradiated, light absorbed by a silicon film operates on only annealing for the silicon film, so that the aluminum can be used without increasing the temperature of the aluminum.

FIGS. 4A to 4E snow steps for manufacturing thin film transistors having an aluminum gate based on the above-described considerations. First, a backing insulation film 402 is formed on a substrate 401 and island-like crystalline semiconductor regions 403 and 404 are formed thereon. An insulation film 405 which serves as a gate insulation film is formed to cover those regions. (FIG. 4A.)

Then, gate electrodes/gate lines 406 and 407 are formed by using a material mainly composed of aluminum. (FIG. 4B).

Next, impurities (e.g., phosphorous (P) or boron (B)) are implanted on a self-alignment using the gate electrodes/gate lines 406 and 407 as masks according to the ion implantation method, ion doping method, or the like to form impurity regions 408 and 409. In this case, phosphorous is implanted in the impurity region 408 and boron is implanted in the impurity region 409. As a result, the former becomes an N-type region and the latter becomes a P-type region. (FIG. 4C.)

Thereafter, a pulse laser beam is directed from the upper side to active the regions where impurities have been introduced. (FIG. 4D.)

Finally, an interlayer insulator 411 is deposited; a contact hole is formed in each of the impurity regions; electrodes/lines 412 through 416 connected to the contact holes are formed to complete thin film transistors. (FIG. 4E.)

According to the above-described method, however, the boundaries between the impurity regions and regions wherein channels are to be formed (semiconductor regions directly under gate electrodes which are sandwiched by the impurity regions, e.g., the region indicated by 410 in FIG. 4D. are electrically unstable because they have not been subjected to a sufficient treatment during processing. It has been found that those regions create problems such as an increase in a leak current, thereby reducing reliability after use for a long period.

Specifically, as apparent from the processing steps illustrated, neither introduction of impurities nor laser irradiation takes place under the gate electrode once it is formed. Therefore, substantially no change occurs in the crystallinity of the region where a channel is to be formed.

On the other hand, impurity regions adjacent to a region wherein a channel to be formed initially have the same crystallinity as that of the region wherein a channel is formed. However, the crystallinity is decreased by the introduction of impurities. Although the impurity regions are repaired by a laser irradiation process performed later, it is difficult to obtain the initial crystallinity. Especially, the areas of the impurity regions which are adjacent to the active region can not be sufficiently activated because such areas are not likely to be irradiated with laser light. Specifically, since the crystallinity is discontinuous between the impurity regions and the active region, a trap level or the like produces easily. Especially, when impurities are introduced using a method wherein accelerated ions are applied, impurity ions are dispersed into the area under the gate electrode portion and destroy the crystallinity in that area. It has not been possible to activate such an area under a gaze electrode portion using a laser beam or the like because the gate electrode portion blocks the beam.

This equally applies to the gate insulation film. Specifically, while the gate insulation film above the region wherein a channel is to be formed remains in the initial state, the gate insulation film above the impurity regions undergoes great changes during steps such as introduction of impurities and laser irradiation. As a result, many traps occur at the boundaries between those regions.

One possible solution to this problem is to perform activation by irradiating the substrate on the rear side thereof using a laser or the like. According to this method, since the gate lines are not blocked from the light, the boundaries between the active regions and impurity regions are sufficiently activated. In this case, however, the material of the substrate must transmit light. Since most glass substrates can not easily transmit ultraviolet rays having wavelengths of 300 nm or less, for example, a KrF excimer laser (having a wavelength of 248 mm) that excels in mass productivity can not be used.

Further, during the laser irradiation step as described above, aluminum is heated to a high temperature, although only instantaneously. This has resulted in abnormal growth of aluminum crystals (hillock). Especially, abnormal growth in the vertical direction can cause a short circuit between the aluminum crystals and wiring above them.

When ion doping is carried out to dope impurities, another problem arises. Ion doping is a method wherein a gas including impurities for doping (e.g., phosphine ($PH_3$) if phosphorous is to be doped and diborane ($B_2H_6$) if boron is to be doped) is subjected to electrical discharge and resulting ions are taken out and emitted using a high voltage.

This method is simpler compared to ion implantation and is suitable for processing a large surface area. According to this method, however, various ions are emitted because mass separation is not performed. Especially, a very large amount of hydrogen ions are emitted both in atomic and molecular states. If such hydrogen ions exist in the gate insulation film in the vicinity of a gate electrode (the gate insulation film above the region 410), fluctuations in characteristics can be caused when a voltage is applied. Especially, the method shown in FIGS. 4A to 4E has had a problem in that hydrogen implanted in a gate electrode can not be sufficiently removed.

SUMMARY OF THE INVENTION

The present invention confronts the above-described problems, and it is an object of the present invention to provide a method of manufacturing a reliable thin film transistor by achieving continuity in crystallinity between active regions and impurity regions and to provide a high performance thin film semiconductor integrated circuit by integrating such highly efficient thin film transistors.

The present invention solves the above-described problems by activating regions wherein channels are to be formed in addition to impurity regions and gate insulation film using a thermal annealing or an optical annealing process wherein those regions are irradiated by optical energy emitted by an intense light source such as a laser or a flash lamp.

The present invention employs a basic configuration as follows. First, a material which serves as a mask for the formation of impurity regions is formed on island-like crystalline semiconductor regions and, thereafter, doping impurities are introduced into semiconductor films by means of ion doping or the like using the mask. Preferable materials for the mask include insulating materials such as organic materials, e.g., polyimude and silicon-containing materials, e.g., silicon oxide and silicon nitride and conductive materials such as metals, e.g., aluminum, tantalum, and titanium and conductive metal nitrides, e.g. tantalum nitride and titanium nitride. If it is desirable to prevent the semiconductor regions from directly contacting the mask, a film of silicon oxide or silicon nitride may be formed between them.

Next, the mask is removed to form an insulation film which serves as a gate insulation film. Thereafter, a thermal annealing process or an optical annealing process is performed not only to activate the doped impurities but also to improve the characteristics of the interface between the gate insulation film and the regions wherein channels are to be formed and the characteristics of the boundaries between the regions wherein channels are formed and the impurity regions. This may be achieved using an optical annealing process or a thermal annealing process alone or using a combination of optical and thermal annealing processes.

In the thermal annealing process, the annealing temperature is set at 650° C. or less. If the optical annealing process is performed using a laser, it is possible to use various excimer lasers including KrF lasers (wavelength: 248 nm), XeCl lasers (wavelength: 308 nm), ArF lasers (wavelength: 193 nm), and XeF lasers (wavelength: 353 nm), Nd:YAG lasers (wavelength: 1064 nm) and second, third and fourth harmonics thereof, carbon dioxide lasers, argon ion lasers, copper vapor lasers, and the like.

Incoherent light sources are inexpensive and readily available. For example, xenon lamps, krypton arc lamps, halogen lamps and the like may be used. Optical processing using such light sources is not limited to irradiation of the semiconductor region on the upper surface thereof but may be performed by irradiating the semiconductor region on the bottom surface or on both upper and bottom surfaces thereof.

Such a thermal annealing process or optical annealing process can be effectively performed in an atmosphere containing halogen elements (atmosphere containing hydrogen chloride, chlorine, ethylene trichloride, hydrogen fluoride, fluorine, nitrogen trifluoride, and the like) or an oxygen atmosphere (atmosphere containing oxygen, nitrogen oxides of various types, ozone, and the like).

A gate electrode may be formed so that it is offset from impurity regions or so that it overlaps with the impurity regions. An offset gate will reduce the leak current of the TFT. However, since an offset gate has small amount of current when the TFT is turned on, it has the disadvantage of low operating speed. For this reason, offset gates are normally used only in pixel switching TFTs and sampling TFTs of an active matrix circuit, whereas gates which slightly overlap with impurity regions are used for other logic circuits. Although an overlap gate is not suitable for high speed operations because it has a parasitic capacity, it has no problem in driving an active matrix circuit.

The upper and side surfaces of all or some parts of gate electrodes and gate lines thus formed are anodized to form aluminum oxide films having high voltage withstand characteristics which prevent the gate electrodes and gate lines from shorting with wiring in the layer above them. The formation of such anodic oxide films is effective for preventing interlayer short circuits especially in an active matrix circuit wherein may lines intersect with each other. Further, since aluminum oxide has a high dielectric constant, it can form a capacitor with a line in the layer above it. Although anodization is normally performed in an electrolytic solution on an electrochemical basis, it goes without saying that it may be performed in a low pressure plasma atmosphere as in the well-known plasma anodization process.

According to the present invention, the gate electrodes and gate lines have not been formed when a thermal annealing or an optical annealing is carried out to activate impurities which have been doped. This relaxes the tolerance for a thermal annealing or an optical annealing when compared to the conventional doping on a self alignment as shown in FIGS. 4A to 4E. For example, the present invention allows the use of a thermal annealing or a flash lamp annealing unlike the prior art.

In a thermal annealing process, since the impurity regions, the regions wherein channels are formed, and gate insulation films are uniformly heated, no discontinuity occurs at the boundaries between them. Similarly, no discontinuity occurs in the case of an optical annealing because there is no gate electrode which blocks light.

An optical annealing or a thermal annealing provides an effect of replacing residual hydrogen atoms in the gate insulation films and semiconductor regions when performed in an halogen atmosphere or an oxidizing atmosphere. Strong electrical fields are generated at the gate insulation films and regions wherein channels are formed. If hydrogen atoms exist in the form of a silicon-hydrogen or oxygen-hydrogen combination in such electrical fields, the electrical fields decouple the hydrogen atoms, thereby causing changes in the characteristics of those regions over time. When a halogen, especially fluorine or chlorine, exists in those regions instead of hydrogen, the characteristics of those regions are stable. This is because a halogen is very strongly coupled with silicon or oxygen and is not easily decoupled.

Further, when an ion doping process is used to dope impurities, the ion doping is carried out in the absence of the gate insulation films. As a result, hydrogen ions are not implanted in the gate insulation films, and this provides very stable characteristics.

In addition, in a circuit having intersecting lines, the anodization of the upper and side surfaces of the gate electrodes prevents the gate electrodes from shorting with lines in the layer above them due to the occurrence of hillock. Especially, aluminum is characterized in that it provides an anodic oxide film having high voltage resistance which has not been achievable with a conventional silicon gate.

BRIEF DESCRIPTION OF THE DRAWINGS

FIGS. 2A to 2F show a second embodiment of the present invention.

FIGS. 3A to 3F show a third embodiment of the present invention.

DETAILED DESCRIPTION OF THE PREFERRED EMBODIMENTS

FIGS. 1A to 1D show a first embodiment of the present invention. The present embodiment represents steps for forming a thin film transistor circuit having an intersection on an insulating substrate. A substrate 101 is a glass substrate, e.g., a no-alkali borosilicate glass substrate such as the glass of product No-7059 available from Corning Corp. A silicon oxide film 102 is deposited on the substrate as a base oxide film. For example, the silicon oxide film can be deposited using sputtering or chemical vapor deposition (CVD). In this case, the film is formed using TEOS (tetraethoxysilane) and oxygen as material gases according to the plasma CVD method. The temperature of the substrate is 200 to 400° C. The thickness of the base silicon oxide film is 500 to 2000Å.

Next, an amorphous silicon film is deposited using plasma CVD or low pressure CVD. In this case, the amorphous silicon film is deposited using monosilane ($SiH_4$) as a material gas according to the plasma CVD method. The thickness of the amorphous silicon film is 1000 to 1500 Å. This film is crystallized by annealing it at 600° C. for 72 hours. The resulting crystalline silicon film is etched to form a silicon region 103 in the form of an island.

Figure 1A:
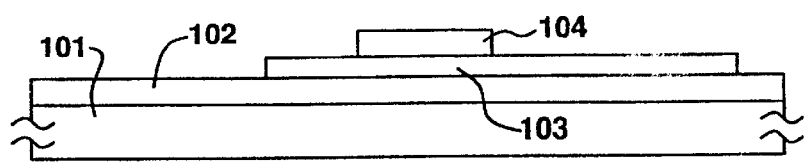
FIGS. 1A to 1G show a first embodiment of the present invention.

Thereafter, a silicon nitride film is formed on the entire surface using a plasma CVD process to a thickness of 1000 to 6000 Å, e.g., 3000 Å. The thickness is set to a value such that the film can sufficiently function as a mask during doping. The silicon nitride film is then etched to form a mask 104 for doping. (FIG. 1A.)

In this state, boron ions are doped using an ion doping process wherein a gas obtained by diluting diborane ($B_2H_6$) with hydrogen is subjected to electrical discharge and the resulting ions are taken out using a high voltage to be applied to the substrate. The voltage for accelerating the ions depends on the thickness of the silicon region. When the thickness of the silicon region is 1000 Å, the adequate voltage is 10 to 30 kV. In this embodiment, the voltage is 20 kV. The dose is $1 \times 10^{14}$ to $6 \times 10^{15}$ atoms/cm$^2$, e.g., $5 \times 10^{14}$ atoms/cm$^2$.

Figure 1B:
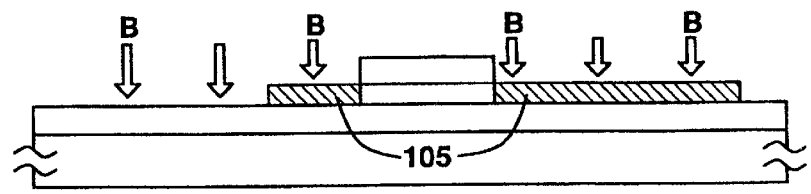

Thus, a P-type impurity region 105 is formed. The range of the impurity region illustrated represents only a nominal range, and it goes without saying that the ions actually wrap around the mask due to dispersion of ions and the like. (FIG. 1B)

Figure 1C:
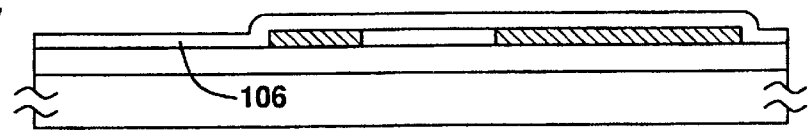

Next, the nitride mask 104 is removed, and a silicon oxide film 106 serving as a gate insulation film is formed to a thickness of 800 to 1500 Å, e.g., 1200 Å. This film is formed using the same method as for the backing silicon oxide film 102. Then, annealing is performed at 600° C. for 12 to 48 hours, e.g., 24 hours to activate the doped impurities and to improve the characteristics of the interface between the gate insulation film and the silicon region. In this step, excessive hydrogen can be removed from the gate insulation film 106. (FIG. 1C.)

Figure 1D:
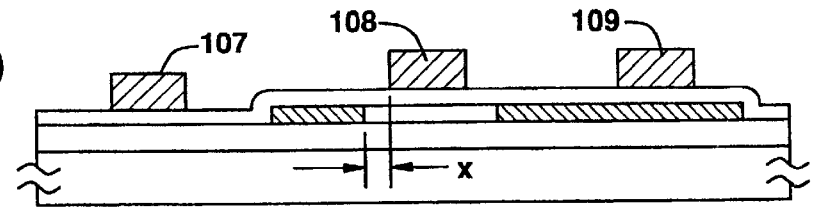

Thereafter, a sputtering process is performed to form an aluminum film (containing silicon of 1 to 5 percent by weight) having a thickness of 3000 to 8000 Å, e.g., 5000 Å. This film is then etched to form aluminum gate electrodes/ gate lines 107, 108, and 109. The gate electrode 108 is formed to have an offset configuration with an offset width x of 0.3 to 2 μm. The gate line 109 is formed above the impurity region. Therefore, the gate electrode 109 does not function as a gate electrode of a TFT but functions as one of the electrodes of a capacitor. The gate line 107 is electrically connected to other gate electrodes/gate lines 108 and 109. (FIG. 1D.)

The gate electrodes/gate lines 107 through 109 are anodized by flowing a current therethbough to form fine anodic oxide (aluminum oxide) films 110, 111, and 112 on the upper and side surfaces thereof to a thickness of 1000 to 2500 Å. The anodization is carried out by immersing the substrate in an ethyleneglycol solution containing 1 to 5% citric acid whose pH is adjusted to about 7 using ammonia and by increasing the applied voltage by 1 to 5 volts per minute with all the gate lines of the active matrix circuit serving as positive poles.

Figure 1E:
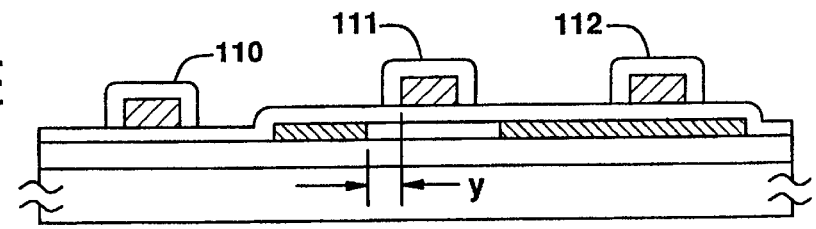

The anodic oxide films formed as described above are referred to as barrier type anodic oxides and are excellent in voltage withstand characteristics. The guaranteed withstand voltage is 80% of the maximum applied voltage. Since these anodic oxides on the gate electrodes are provided to prevent the gate electrodes from shorting with the lines in the layer above them, the thickness of those oxides may be set to a value which is appropriate for such a purpose. This anodization process shaves the sides of the gate electrodes, and this slightly increases the offset width to a value y(>x). (FIG. 1E.)

Figure 1F:
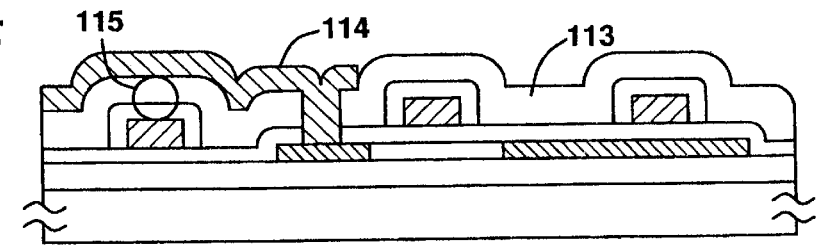

Then, a plasma CVD process is performed using TEOS as a material gas to form a silicon oxide film 113 as a layer insulator to a thickness in the range from 2000 to 10000 Å, e.g., 5000 Å, and a contact hole is formed in this film. A multi-layer film is formed from materials such as metals, e.g., titanium nitride of a thickness of 1000 Å and aluminum of a thickness of 5000 Å. This film is then etched to form an electrode/line 114 in the impurity region. The line 114 intersects with the gate line 107 as illustrated 115. However, the presence of the layer insulator 113 and the anodic oxide 110 prevents the intersection 115 from shorting with the lines in the layer above it. (FIG. 1F.)

Figure 1G:
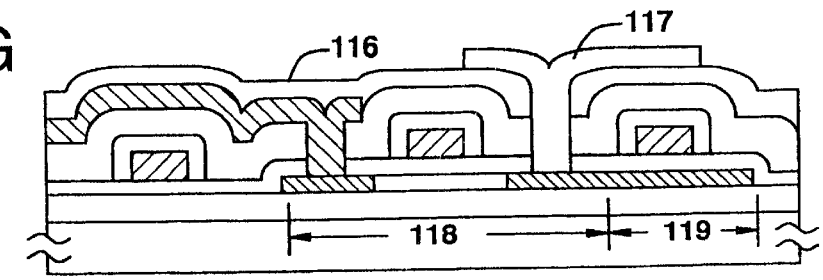
Figure 4A:
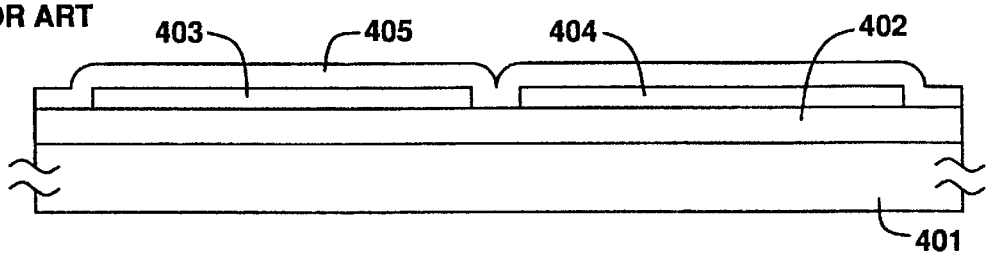
FIGS. 4A to 4E show an example of the prior art.
Figure 4B:
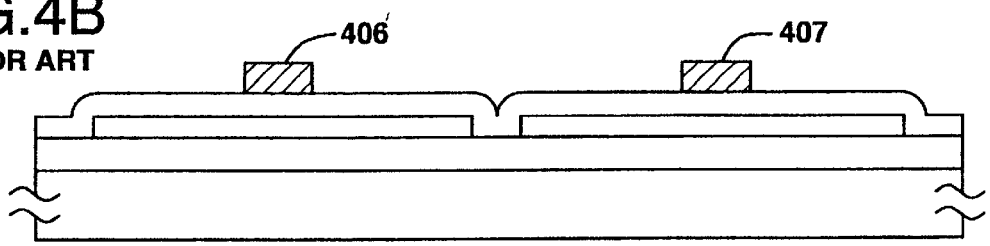
Figure 4C:
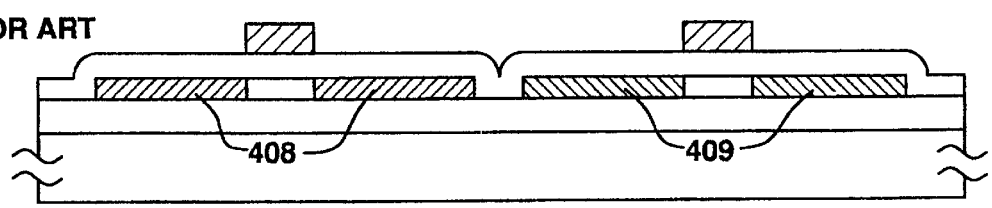
Figure 4D:
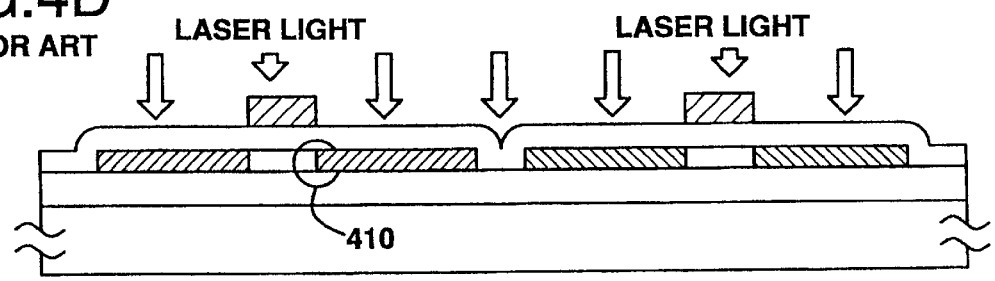
Figure 4E:
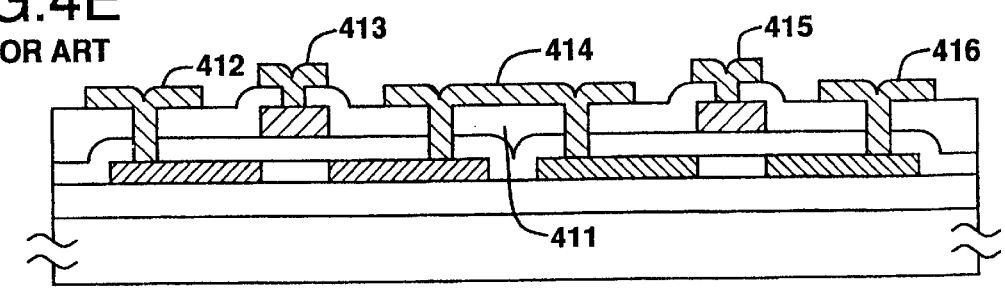

Finally, a silicon nitride film 116 is formed as a passivation film using a plasma CVD process to a thickness of 2000 to 6000 Å, e.g., 3000 Å. The film 116 and the silicon oxide film 113 are etched to form a contact hole that reaches the impurity region 105. Then, a transparent conductive film (e.g., an indium tin oxide film) is formed and is etched to form a pixel electrode 117. (FIG. 1G.)

The above-described steps provide a P-channel type TFT 118 having an offset structure. Further, a capacity 119 (for which the gate insulation film 106 serves as a dielectric) can be formed adjacent to the TFT 118. In the present embodiment, the TFT 118 is a TFT used as a pixel switching element or a sampling TFT of an active matrix circuit.

FIGS. 2A to 2F show a second embodiment of the present invention. The present invention is the same as the first embodiment up to the doping process except that an element as a catalyst for promoting crystallization is added during the crystallization of amorphous silicon. Therefore, see FIGS. 1A and 1B for the steps up to the doping step.

First, like the first embodiment, an amorphous silicon film is formed on a substrate having a base oxide film formed thereon to a thickness of 300 to 1000 Å e.g., 500 Å. Then, after forming a thin nickel acetate film or nickel film, the amorphous silicon is crystallized by annealing it in a nitrogen or an argon atmosphere at 500 to 580° C. for 2 to 8 hours. In this step, nickel serves as a catalyst for promoting the crystallization. The resulting crystalline silicon film is etched to form a silicon region in the form of islands.

Thereafter, a plasma CVD process is performed on the entire surface to form a silicon oxide film having a thickness of 1000 to 6000 Å, e.g., 3000 Å. This silicon oxide film is then etched to form a mask for doping (not shown). Then, a region where an N-channel type TFT is to be formed is covered with a photoresist mask.

With such an arrangement, boron ions are doped using an ion doping process. The doping gas used is diborane diluted with hydrogen ($B_2H_6$). The ions are accelerated by 5 to 30 kv, e.g., 10 kV. the dose is $1\times10^{14}$ to $6\times10^{15}$ atoms/cm$^2$, e.g., $2\times10^{14}$ atoms/cm$^2$. Thus, P-type impurity regions 202 and 203 are formed.

Similarly, phosphorous ions are doped using an ion doping process. The doping gas used is phosphine diluted with hydrogen ($PH_3$). The ions are accelerated by 5 to 30 kV, e.g., 10 kV. The dose is $1\times10^{14}$ to $6\times10^{15}$ atoms/cm$^2$, e.g., $5\times10^{14}$ atoms/cm$^2$. Thus, an N-type impurity region 201 is formed.

Next, masks (not shown) are removed, and a silicon oxide film 204 which serves as a gate insulation film is formed to a thickness of 800 to 1500 Å, e.g., 1200 Å. A KrF excimer laser beam (wavelength: 248 nm) is directed to activate the doped impurities and to improve the characteristics of the interface between the gate insulation film and the silicon region. The preferable energy and the number of shots of the laser are 250 to 450 mJ/cm$^2$ and 2 to 50 shots, respectively. The activation can be more efficiently performed by heating the substrate to 250 to 550° C. during the application of the laser beam.

The energy density and the number of shots depend on the silicon film. Therefore, such values may be optimized in consideration to the density, crystallinity, the dose of doping, etc. of the silicon film used. Typically, a sheet resistance of 500 to 1000 Ω/sguare is obtained for a phosphorous-doped silicon film where the dose is $2\times10^{14}$ atoms/cm$^2$; the substrate temperature is 250° C.; and the laser energy is 300 mJ/cm$^2$. As apparent from FIGS. 2A to 2F, since the boundaries between the impurity regions and the active regions are also irradiated by the laser, it is possible to significantly suppress the reduction of reliability due to the deterioration of the boundaries as encountered in the conventional manufacturing process (FIGS. 4A to 4E).

When crystallization is carried out using a catalyzer element such as nickel as in the present embodiment, it is observed that some areas remain in an amorphous silicon state. Such residual amorphous silicon areas can be completely crystallized by the above-described laser irradiation step.

Further, according to the present embodiment, the gate insulation film is formed after the ion doping step. As a result, the gate insulation film contains no excessive hydrogen. Even if there is excessive hydrogen, it can be removed at the above-described laser irradiation step. This suppresses fluctuations (deterioration) in characteristics.

After this step, thermal annealing at 500 to 600° C. may be performed again. (FIG. 2A.)

Thereafter, sputtering is performed to form an aluminum film (containing scandium of 0.1 to 0.5 percent by weight) having a thickness of 3000 to 8000 Å, e.g., 5000 Å. An anodic oxide film having a thickness in the range from 100 to 300 Å may be formed on the surface of the aluminum in order to improve the tightness of the contact between the aluminum film and a photoresist mask during a later step (the step of forming a porous anodic oxide). This can be achieved by immersing the substrate in an ethyleneglycol solution containing 1 to 5% citric acid whose pH has been adjusted to about 7 using ammonia and by applying 5 to 20 V to the entire aluminum film.

This film is then etched to form aluminum gate electrodes/ gate lines 205, 206, 207, and 208. The gate electrodes/gate lines 205, 206, and 207 overlap impurity regions 201, 202, and 203, respectively, by about 1 μm. The gate line 208 is formed above an impurity region. Therefore, the gate line 208 does not function as a gate electrode of a TFT but functions as one of the electrodes of a capacitor. The gate electrodes 205 and 206 are completely electrically insulated from the gate electrodes 207 and 208. The photoresist masks 209, 210, 211, and 212 used in the above-described pattern etching step are left as they are. (FIG. 2B.)

A current is applied to the gate electrodes/gate lines 207 and 208 in an electrolytic solution to form porous anodic oxides 213 and 214 on the sides of these gate electrodes. This anodization step is carried out using an aqueous solution containing 3 to 20% acid such as citric acid, nitric acid, phosphoric acid, chromic acid, and sulfuric acid. In this case, thick anodic oxides having a thickness of 0.5 μm or more, e.g., 2 μm, is formed using a low voltage of 10 to 30 V. The width of the anodic oxide depends on the duration of the anodization. The gate electrodes/gate lines 205 and 206 are not anodized because no current is applied to them. (FIG. 2C.)

All of the gate electrodes 205 through 207 have initially overlapped the respective impurity regions by about 1 μm. However, only the gate electrode 207 is now offset from the respective impurity region by 1 μm because the gate electrode becomes small by 2 μm by the anodization. Thus, the width of the offset can be stably controlled using anodization.

Thereafter, the photoresist masks 209 through 212 are removed, and another photoresist 215 is applied to cover the areas other than the active matrix circuit. Anodization is performed by applying a current to the gate electrodes/gate lines 207 and 208 to obtain fine barrier-type anodic oxide (aluminum oxide) films 216 and 217 having a thickness of 1000 to 2500 Å inside the porous anodic oxides 213 and 214 and on the upper surfaces of the gate electrodes/gate lines 207 and 208. The anodization is carried out by immersing the substrate in an ethyleneglycol solution containing 1 to 5% citric acid whose pit has been adjusted to about 7 using ammonia and by increasing the applied voltage by 1 to 5 V per minute with all the gate lines of the active matrix circuit serving as positive poles. The areas other than the area of the active matrix area are masked by the photoresist 215 and are electrically insulated from the active matrix circuit. Therefore, such areas are not anodized. (FIG. 2D.)

The photoresist 215 is then removed, and a plasma CVD process is performed using TEOS as a material gas to form a silicon oxide film 218 as a layer insulator to a thickness of 2000 to 10000 Å, e.g., 5000 Å, and a contact hole is formed in this film. A 5000 Å thick aluminum film is formed and is etched to form electrodes/lines 219 to 224 on the impurity regions and gate lines. Although contacts are formed on the gate electrodes above the silicon regions, in practice, the contacts are formed on the gate lines in the areas other than the silicon regions.(FIG. 2E.)

Finally, a silicon nitride film 225 is formed as a passivation film using a plasma COVD process to a thickness of 2000 to 6000 Å, e.g., 3000 Å. The film 225 and the silicon oxide film 218 are etched to form a contact hole that reaches the impurity region 203. Then, a transparent conductive film (e.g., an indium tin oxide film) is formed and is etched to form a pixel electrode 226. (FIG. 2F.)

The above-described steps provide an N-channel type TF-T 227 and P-channel type TFTs 228 and 229. Further, a capacitor 230 (for which the gate insulation film 204 serves as a dielectric) also can be formed adjacent to the TFT 229. In the present embodiment, the TFT 229 is a TFT used as a pixel switching element or a sampling TFT of an active matrix circuit while the TFTs 227 and 228 are TFTs used in other logic circuits.

Figure 5:
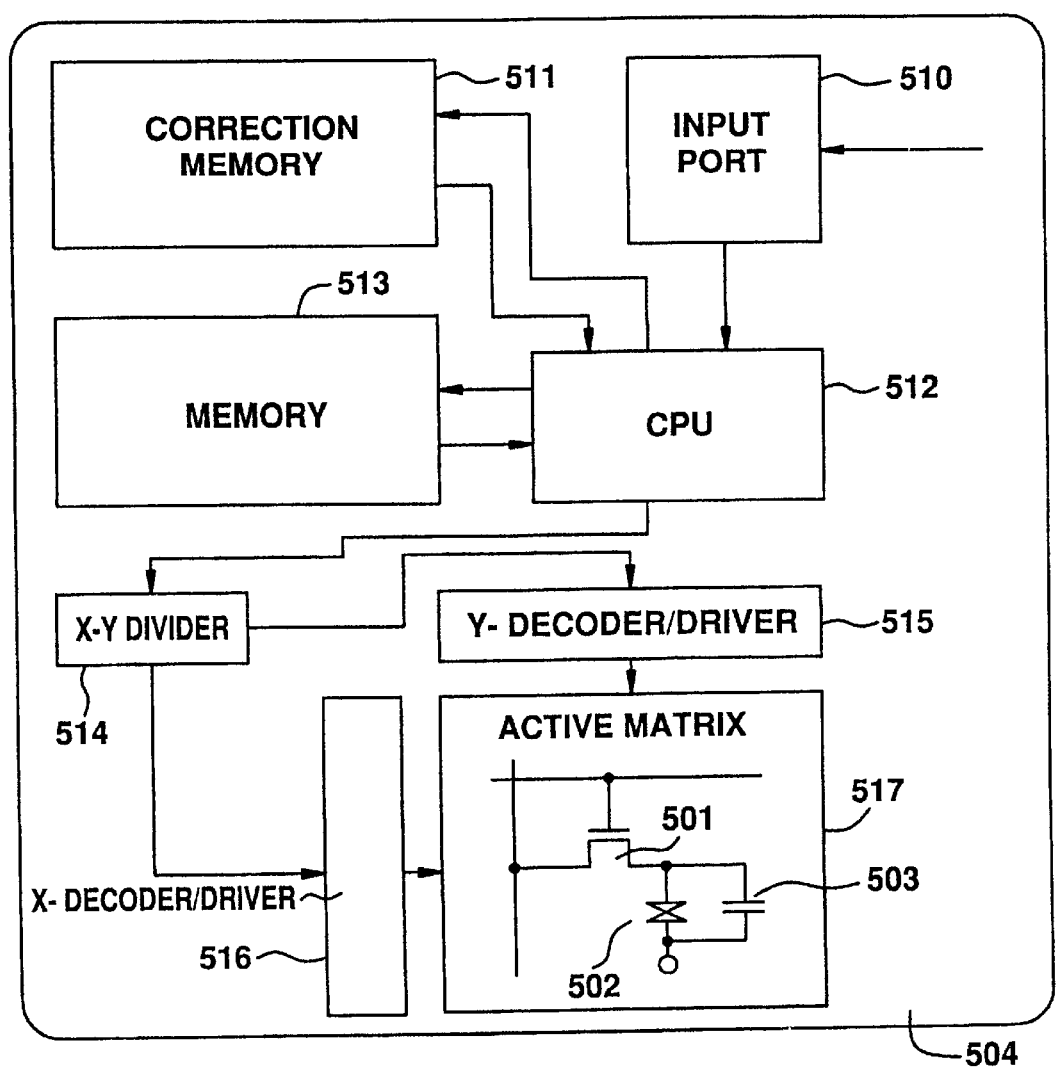
FIG. 5 is a block diagram of an integrated circuit embodying the present invention.

FIG. 5 is a block diagram showing an active matrix circuit, a driver circuit for the same, and other circuits configured using the TFTs described in the present embodiment formed on a substrate 504. The TFTs 227 and 228 are used in the logic circuits of X and Y decoder/drivers 515 and 516, a CPU 512, an input port 510, an X-Y divider 514 and various memories 511 and 513. The TFT 229 is used as pixel switching TFTs 501 of the active matrix circuit 517, sampling TFT of the driver circuits and matrix elements of memories. The capacitor 230 is used as auxiliary capacitors 503 of pixel cells 502 of the active matrix circuit 517 and as memory elements in memory circuits.

FIGS. 3A to 3F show a third embodiment of the present invention. First, a base silicon oxide film is formed on a substrate (Corning 7059), and an amorphous silicon film in the form of islands is formed to a thickness of 300 to 1000 Å, e.g., 500 Å. Then, the amorphous silicon film is crystallized by laser irradiation.

The laser to be used is a KrF excimer laser (wavelength is 248 nm and pulse width is 20 nsec.), and the energy density of the laser is 250 to 450 mJ/cm$^2$. The substrate is heated to 350 to 450° C. during the laser irradiation. The number of shots of the laser is 2 to 10. The energy density, the number of shots, and the temperature of the laser depend on the property of the amorphous silicon film. Therefore, the optimum values may be selected depending on the property of the film. Although a pulse laser is used in the present embodiment, a continuous oscillation type laser such as an argon ion laser may be used. The resulting crystalline silicon film is etched to form island-like silicon regions.

Thereafter, a silicon nitride film 301 having a thickness of 500 Å is deposited on the entire surface using a plasma CVD process. Subsequently, a silicon oxide film having a thickness of 3000 Å is formed on the entire surface again using a plasma CVD process. This silicon oxide film is etched to form masks 302, 303, and 304 for doping.

Further, the region where an N-channel type TFT is to be formed is covered with a photoresist mask 305.

With such an arrangement, boron ions are doped using an ion doping. The doping gas is diborane diluted with hydrogen ($B_2H_6$). The ions are accelerated by 10 to 50 kV, e.g., 20 kV. The acceleration voltage needs co be increased taking the presence of the silicon nitride film 301 into consideration. The dose is $1\times10^{14}$ to $6\times10^{15}$ atoms/cm$^2$, e.g., $3\times10^{15}$ atoms/cm$^2$. Thus, P-type impurity regions 306 and 307 are formed. (FIG. 3A.)

After removing the photoresist mask 305, an ion doping is performed again to dope phosphorous ions. The doping gas is phosphine diluted with hydrogen ($PH_3$). The ions are accelerated by 10 to 50 kV, e.g., 20 kV. The dose is $1\times10^{14}$ to $6\times10^{13}$ atoms/cm$^2$, e.g., $1\times10^{15}$ atoms/cm$^2$. Although phosphorous is implanted across the entire surface, the P-type impurity regions 306 and 307 remain the conductivity type P because the dose of the phosphorous is smaller than that of the boron which is previously doped. Thus, an N-type impurity region 309 is formed. (FIG. 3B.)

Next, a photoresist mask 308, the masks 302 through 304, and the silicon nitride film 301 are removed, and a silicon oxide film 310 which serves as a gate insulation film is formed to a thickness of 800 to 1500 Å, e.g., 1200 Å. Then, a beam from a halogen lamp is instantaneously directed to activate the doped impurities and to improve the characteristics of the interface between the gate insulation film and the silicon region.

The intensity of the beam emitted by the lamp is adjusted so that the monitored temperature on the single crystal silicon wafer is 800 to 1300° C. and typically 900 to 1200° C. Specifically, the temperature of a thermocouple embedded in the silicon wafer is monitored and fed back to the infrared light source. The temperature is increased at a constant rate of 50 to 200° C./sec. and is decreased on a self-cooling basis to 20 to 100° C.

Intrinsic or substantially intrinsic amorphous silicon well absorbs visible rays, especially, rays of wavelengths shorter than 0.5 μm and such rays are converted into heat.

According to the present invention, rays of wavelengths of 0.5 to 4 μm are used. Rays hating wavelengths in this range can be effectively absorbed by the crystallized intrinsic or substantially intrinsic (the amount of phosphorous or boron is $10^{17}$ cm$^{-3}$ or less) silicon film and can be converted into heat. Far infrared rays having wavelengths of 10 μm or longer are absorbed by the glass substrate to heat the substrate. However, when most of the rays have wavelengths of 4 μm or shorter, the temperature rise at the glass is very small. That is, wavelengths of 0.5 to 4 μm are effective for enhancing crystallinity of the silicon film which has already been crystallized.

As apparent from FIGS. 3A to 3F, according to the present embodiment, the substrate is irradiated on both top and bottom thereof. This significantly suppresses the reduction in reliability due to deterioration at the boundaries encountered in the conventional manufacturing process (FIG.4A to 4E).

Thereafter, a thermal annealing process is performed at 500 to 600° C. for 2 to 48 hours, e.g., at 550° C. for 4 hours. Then, sputtering is performed to form an aluminum film (containing scandium of 1 to 5% by weight) having a thickness of 3000 to 8000 Å, e.g., 5000 Å. This film is then etched to form aluminum gate electrodes/gate lines 311, 312, 313, and 314.

As in the second embodiment, areas other than an active matrix circuit are covered with a photoresist 315 and a current is applied to the gate electrodes/gate lines 313 and 314 to perform an anodization. Thus, an aluminum oxide film having a thickness of 1000 to 2500 Å is formed, and barrier type anodic oxide films are formed on the upper and side surfaces of the gate electrodes/gate lines 313 and 314.

The gate electrodes/gate lines 311 and 312 are formed to overlap the impurity regions 309 and 306, respectively. On the other hand, the gate electrode/gate line 313 is formed to have an offset configuration. The present embodiment is different from the second embodiment in that one side of the impurity region 307 (the side on which a pixel electrode is formed) is in an offset relationship and the other side is in an overlapping relationship with the respective gate electrode/gate line. The gate line 314 is formed above an impurity region. Therefore, the gate line 314 does not function as a gate electrode of a TFT but functions as one of the electrodes of a capacitor. (FIG. 3D.)

Then, the photoresist 315 is removed. A plasma CVD process is performed using TEOS as a material gas to form a silicon oxide film 316 as a layer insulator-to a thickness of 5000 Å, and a contact hole is formed in this film. An aluminum film having a thickness of 5000 Å is formed and is etched to form electrodes/lines 317 through 322 on the impurity regions and gate lines. (FIG. 3E.)

Finally, a silicon nitride film 323 is formed as a passivation film using a plasma CVD to a thickness of 3000 Å. The film 323 and the silicon oxide film 316 are etched to form a contact hole that reaches the impurity region 307. Then, a transparent conductive film (e.g., an indium tin oxide film) is formed and is etched to form a pixel electrode 324. (FIG. 3F.)

The above-described steps provide an N-channel type TFT 325 and P-channel type TFTs 326 and 327. Further, a capacitor 328 (for which the gate insulation film 310 serves as a dielectric) can be formed adjacent to the TFT 327. In the present embodiment, the TFT 327 is a TFT used as a pixel switching element or a sampling TFT of an active matrix circuit while the TFTs 325 and 326 are TFTs used in other logic circuits.

The present invention makes it possible to provide a thin film semiconductor integrated circuit which has less defects and in which gate electrodes and gate lines are formed of a material mainly composed of aluminum. A TFT according to the present embodiment has high reliability and less deterioration even though it is manufactured through low temperature processes at 650° C. or lower. Specifically, there is no significant change in the characteristics of the transistor after 10 hours or longer in a state wherein the source is grounded and a voltage of +20 V or higher or −20 V or lower is applied to one or both of the drain and the gate. Thus, the present invention is advantageous from the industrial point of view.

What is claimed is:

1. A method for forming a semiconductor device comprising:
   forming a crystalline semiconductor island over a substrate;
   forming a mask over said crystalline semiconductor island;
   introducing an impurity of one conductivity type into said crystalline semiconductor island using said mask;
   removing said mask after said introducing step;
   optically annealing said crystalline semiconductor island after the removal of said mask; and
   forming a gate electrode over said crystalline semiconductor island after the optical annealing.

2. A method according to claim 1 wherein said optical annealing is carried out by using a lamp selected from the group consisting of a xenon lamp, a krypton arc lamp and a halogen lamp.

3. A method according to claim 1 wherein said optical annealing is carried out by using YAG laser light, a second harmonic thereof, a third harmonic thereof or a fourth harmonic thereof.

4. A method according to claim 1 wherein said optical annealing activates said impurity.

5. A method for forming a semiconductor device comprising:
   forming a crystalline semiconductor island over a substrate;
   forming a mask over said crystalline semiconductor island;
   introducing an impurity of one conductivity type into said crystalline semiconductor island using said mask;

removing said mask after said introducing step;

forming an insulating film over said crystalline semiconductor island after the removal of said mask;

optically annealing said crystalline semiconductor island after the formation of said insulating film;

forming a conductive film over said insulating film after the optical annealing; and patterning said conductive film into a gate electrode and a first capacitor forming electrode to form a capacitor comprising said first capacitor forming electrode and a second capacitor forming electrode part of said semiconductor island with said insulating film between said first capacitor forming electrode and said second capacitor forming electrode part, and to form said gate electrode over said insulating film, wherein said second capacitor forming electrode part contains said impurity.

6. A method according to claim 5 wherein said insulating film is formed by plasma CVD using TEOS and oxygen.

7. A method according to claim 5 wherein said optical annealing is carried out by using a lamp selected from the group consisting of a xenon lamp, a krypton arc lamp and a halogen lamp.

8. A method according to claim 5 wherein said optical annealing is carried out by using YAG laser light, a second harmonic thereof, a third harmonic thereof or a fourth harmonic thereof.

9. A method according to claim 5 wherein said optical annealing activates said impurity.

10. A method for forming a semiconductor device comprising:

forming a crystalline semiconductor island over a substrate;

forming a mask over said crystalline semiconductor island;

introducing an impurity of one conductivity type into said crystalline semiconductor island using said mask to form an impurity region to become at least one of source region and drain region;

removing said mask after said introducing step;

optically annealing said crystalline semiconductor island after the removal of said mask; and forming a gate electrode over said crystalline semiconductor island and overlapping with said impurity region after the optical annealing to form a thin film transistor in at least driver circuit in which said gate electrode is overlapped with said impurity region.

11. A method according to claim 10 wherein said optical annealing is carried out by using a lamp selected from the group consisting of a xenon lamp, a krypton arc lamp and a halogen lamp.

12. A method according to claim 10 wherein said optical annealing is carried out by using YAG laser light, a second harmonic thereof, a third harmonic thereof or a fourth harmonic thereof.

13. A method according to claim 10 wherein said optical annealing activates impurity.

* * * * *